United States Patent
Nguyen et al.

(10) Patent No.: US 11,809,355 B2
(45) Date of Patent: Nov. 7, 2023

(54) UART AGGREGATION AND JTAG SELECTION CIRCUITRY FOR A MULTI-SOLID STATE DRIVE ENVIRONMENT

(71) Applicant: SK hynix Inc., Icheon-si (KR)

(72) Inventors: Lock Duc Nguyen, Morgan Hill, CA (US); Akshay Ganesh, San Jose, CA (US); Priyadarsini Lanka, San Jose, CA (US); Ping Zheng, San Jose, CA (US); Xiaofang Chen, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 184 days.

(21) Appl. No.: 17/169,062

(22) Filed: Feb. 5, 2021

(65) Prior Publication Data

US 2022/0253395 A1    Aug. 11, 2022

(51) Int. Cl.
*G06F 13/38* (2006.01)
*H03K 19/173* (2006.01)
*G06F 13/40* (2006.01)

(52) U.S. Cl.
CPC .......... *G06F 13/385* (2013.01); *G06F 13/387* (2013.01); *G06F 13/409* (2013.01); *H03K 19/1737* (2013.01)

(58) Field of Classification Search
CPC .... G06F 13/385; G06F 13/387; G06F 13/409; H03K 19/1737
See application file for complete search history.

(56) References Cited

U.S. PATENT DOCUMENTS 9,007,854 B1    4/2015    Nemati Anaraki et al.
9,450,610 B1    9/2016    Micheloni et al.
(Continued)

FOREIGN PATENT DOCUMENTS

CN    210129219 U    3/2020
KR    20070029889 A    3/2007
WO    2017166211 A1    10/2017

OTHER PUBLICATIONS

Daesung Kim, Jinho Choi and Jeongseok Ha, "On the soft information extraction from hard-decision outputs in MLC NAND flashu memory," 2012IEEE Global Communications Conference (GL08ECOM), 2012, pp. 3208-3213, doi: 10.1109/GLOCOM.2012.6503608. (Year: 2012).
(Continued)

*Primary Examiner* — Henry Tsai
*Assistant Examiner* — Aurangzeb Hassan
(74) *Attorney, Agent, or Firm* — Weaver Austin Villeneuve & Sampson LLP (57) ABSTRACT

An adaptor device includes a first interface for coupling to a first processor, a second interface for coupling to a second processor, the second interface being different than the first interface, and a plurality of third interfaces, which are different than either the first interface or the second interface. The plurality of third interfaces are configured for coupling to a corresponding plurality of external devices. The adaptor device is configured to receive, at the first interface, a first signal from the first processor. In response to the first signal, the adaptor device couples through the plurality of third interfaces to the plurality of external devices to enable the first processor substantially concurrent access to the plurality of external devices. The adaptor device is also configured to receive, at the first interface, a second signal from the first processor. In response to the
(Continued)

second signal, the adaptor device couples the second processor with a selected one of the plurality of external devices.

20 Claims, 9 Drawing Sheets

(56) References Cited

U.S. PATENT DOCUMENTS

| | | | |
|---|---|---|---|
| 10,613,927 B1 | 4/2020 | Symons et al. | |
| 10,678,662 B2 | 6/2020 | Zhang | |
| 10,790,860 B2 | 9/2020 | Ismail et al. | |
| 10,861,562 B1 | 12/2020 | Xiong et al. | |
| 2007/0042767 A1* | 2/2007 | Stepanian | H04M 1/72415 455/420 |
| 2008/0144642 A1* | 6/2008 | Song | H04L 69/324 370/466 |
| 2008/0212568 A1* | 9/2008 | So | H04L 12/66 370/352 |
| 2012/0290246 A1* | 11/2012 | Bhatnagar | G01R 31/2844 702/122 |
| 2013/0275829 A1 | 10/2013 | Sridhara et al. | |
| 2014/0281828 A1 | 9/2014 | Micheloni et al. | |
| 2015/0331748 A1 | 11/2015 | Cohen et al. | |
| 2016/0253284 A1* | 9/2016 | Cappaert | G06F 13/4282 710/301 |
| 2017/0125114 A1 | 5/2017 | Alhussien et al. | |
| 2017/0139765 A1* | 5/2017 | Ko | G06F 11/0727 |
| 2018/0069623 A1* | 3/2018 | Armoni | G06F 21/43 |
| 2018/0188322 A1* | 7/2018 | Rogel-Favila | G01R 31/31725 |
| 2019/0235858 A1* | 8/2019 | Xie | G06F 8/71 |
| 2019/0286516 A1 | 9/2019 | Jacobvitz et al. | |
| 2019/0379399 A1 | 12/2019 | Varanasi | |
| 2020/0219571 A1 | 7/2020 | Chen et al. | |
| 2020/0220562 A1 | 7/2020 | Tao et al. | |
| 2020/0241959 A1 | 7/2020 | Wang et al. | |
| 2020/0242059 A1* | 7/2020 | Ganor | G06F 13/36 |
| 2020/0250030 A1 | 8/2020 | Sandell et al. | |
| 2020/0294611 A1 | 9/2020 | Yassine | |
| 2020/0403634 A1 | 12/2020 | Zhang et al. | |
| 2021/0270894 A1* | 9/2021 | Spica | G01R 31/3177 |

OTHER PUBLICATIONS

Notice of Allowance dated Jan. 24, 2022 in U.S. Appl. No. 17/150,519.

Raviv, et al., "Data-Driven Ensembles for Deep and Hard-Decision Hybrid Decoding", 2020 IEEE International Symposium on Information Theory (ISIT), Jun. 21-26, 2020, 6 pages.

Sandell, et al., "Machine learning for LLR estimation in flash memory with LDPC codes", IEEE Transactions on Circuits and Systems II: Express Briefs, Aug. 17, 2020, 5 pages.

U.S. Notice of Allowance dated Apr. 14, 2022 in U.S. Appl. No. 17/150,519.

* cited by examiner

UART AGGREGATION AND JTAG SELECTION CIRCUITRY FOR A MULTI-SOLID STATE DRIVE ENVIRONMENT

BACKGROUND OF THE INVENTION

The present disclosure relates generally to systems and methods for communication between electronic devices, and, more specifically, to improving performance monitoring of non-volatile storage devices.

Electronic systems and devices have wide-ranging applications. For example, a solid-state drive (SSD) is a solid-state storage device that uses integrated circuit assemblies to store data persistently, typically using flash memory, and functioning as secondary storage in the hierarchy of computer storage. It is also sometimes referred to as a solid-state device or a solid-state disk. Compared with electromechanical drives, SSDs are typically more resistant to physical shock, run silently, and have quicker access time and lower latency. SSDs store data in semiconductor cells, and can vary in their properties according to the number of bits stored in each cell, for example, single-bit cells ("SLC"), 2-bit cells ("MLC"), 3-bit cells ("TLC"), and quad-bit cells ("QLC").

SSDs can use traditional hard disk drive (HDD) interfaces and form factors for example, Serial Advanced Technology Attachment (Serial ATA or SATA) and Serial Attached Small Computer System Interface (Serial Attached SCSI or SAS), and standard HDD form factors that allow such SSDs to be used as drop-in replacements for HDDs in computers and other devices. Alternatively, SSDs can use newer interfaces, such as Universal Serial Bus (USB), and form factors that exploit specific advantages of the flash memory in SSDs.

These electronic systems and devices are subject to extensive testing to ensure proper operation. While testing of the systems and devices has made significant advances, traditional approaches to debugging problems or issues that are discovered during the testing are less than satisfactory.

SUMMARY OF THE INVENTION

Solid-state drives can use sideband communication channels like Universal Asynchronous Receiver Transmitter (UART) and Joint Test Action Group (JTAG) for logging telemetry data and configuring device behavior for testing and debug purposes. A typical issue with conventional monitoring of traffic and transactions taking place inside the devices under test (DUT) for debug analysis is that they typically require the DUT to be connected to a discrete external instrument (e.g., external monitor). This usually means that the DUT has to be disconnected and removed from the testing environment and connected to an external wiring harness that communicates the information to the external instrument. Furthermore, during device bring-up in typical traditional approaches, only a single DUT can be debugged at a time. The user often has to disrupt or interrupt other testing activities to hook up an external monitor to the DUT to be able to debug the DUT. Hence, there is a need for a solution which can aggregate multiple UART and JTAG channels, and provide a more efficient mechanism for connection, such as a serial bus, e.g., a Universal Serial Bus (USB), to a host personal computer (PC).

In some embodiments of the present disclosure, an adaptor device can convert UART and JTAG channels into a serial bus output so that standard computer systems can be used for interfacing, logging, and debugging. Existing solutions only support a single UART or JTAG channel, creating setup and stability challenges when multiple solid-state drives (SSDs) are enumerated in a system. The device according to this embodiment allows a user to use a single computer to program any of the drives with UART and JTAG signals connected and allows the user to monitor all connected drives' activities substantially simultaneously or concurrently. As an example, in the application of SSD product design validation, the testing and debug time can be reduced due to enhanced logging and controlling capabilities. It will also mean a single hardware adapter can be used for multiple drives, reducing the need for additional test hardware.

In some embodiments of the present disclosure, an adapter device uses integrated circuits (IC's) capable of interfacing multiple UART channels into a single serial/USB output. The outputs of multiple ICs' serial outputs are then aggregated using a USB hub IC. This way, every UART channel can be individually accessed substantially simultaneously/concurrently. Multiple JTAG connections can be consolidated and selectable using a multiplexer logic. Any individual JTAG channel can be selected using jumpers onboard the adapter, or using a serial channel, which controls a Decoder IC for multiplexer selection logic. Buck convertors can be used to convert USB power into Vcc power for the IC's on the adapter.

According to an exemplary embodiment of the present disclosure, an adaptor device includes a USB connector for coupling to USB signals, a JTAG connector for coupling to JTAG signals, and a plurality of dual-purpose connectors configured for coupling to a corresponding plurality of external devices. Each of the plurality of dual-purpose connectors is configured for coupling to both UART signals and JTAG signals. The adaptor device also includes a USB-to-UART interface circuit coupled to the USB connector and the plurality of dual-purpose connectors. The USB-to-UART interface circuit includes a USB hub and a plurality of USB-UART converters. The adaptor device also includes a multiplexer circuit coupled to the JTAG connector and the plurality of dual-purpose connectors. The multiplexer circuit is configured to couple the JTAG connector to one of the plurality of dual-purpose connectors in response to a selection signal.

In some embodiments of the above adaptor device, each of the plurality of dual-purpose connectors includes a first subset of pins configured for coupling to UART signals and a second subset of pins operable for coupling JTAG signals.

In some embodiments, each of the plurality of dual-purpose connector comprises two UART pins and five JTAG pins.

In some embodiments, each of the plurality of external devices is solid-state drives (SSDs).

In some embodiments, each SSD device comprises a dual-purpose connector having both UART pins and JTAG pins for coupling to a corresponding plurality of external devices.

In some embodiments, each SSD is coupled to a dual-purpose connector through an adaptor for coupling to both UART signals and JTAG signals.

In some embodiments, the USB-to-UART interface circuit comprises a USB hub and a plurality of USB-UART converter circuits, and the USB-to-UART interface circuit is configured to enable the USB connector concurrent access to the plurality of dual-purpose connectors.

In some embodiments, the multiplexer circuit receives the selection signal derived from a signal received from the USB connector and configured to couple the JTAG connector to one of the plurality of dual-purpose connectors in response to a selection signal.

In some embodiments, the multiplexer circuit receives the selection signal from a jumper.

In some embodiments, the adaptor device also includes level shifter circuits coupled between the USB-to-UART converters and the dual-purpose connectors.

In some embodiments, the adaptor device also includes a power converter circuit to convert power received from the USB connector to voltages suitable for circuit components in the adaptor device.

In some embodiments, the adaptor device also includes a Printed Circuit Board (PCB) upon which the USB connector, the JTAG connector, the plurality of dual-purpose connectors, and the USB-to-UART switching circuit are disposed.

According to an exemplary embodiment of the present disclosure, an adaptor device includes a first interface for coupling to a first processor, a second interface for coupling to a second processor, the second interface being different than the first interface, and a plurality of third interfaces, which are different than the first interface and the second interface. The plurality of third interfaces are configured for coupling to a corresponding plurality of external devices. The adaptor device is configured to receive, at the first interface, a first signal from the first processor. In response to the first signal, the adaptor device couples through the plurality of third interfaces to the plurality of external devices to enable the first processor substantially concurrent access to the plurality of external devices. The adaptor device is also configured to receive, at the first interface, a second signal from the first processor. In response to the second signal, the adaptor device couples the second processor with a selected one of the plurality of external devices.

In some embodiments of the above adaptor device, the first interface is configured to couple to USB signals, and the second interface is configured to couple to JTAG signals.

In some embodiments, each of the plurality third interfaces is configured to couple to UART signals and JTAG signals, and each of the plurality of external devices is configured to couple to UART signals and JTAG signals.

In some embodiments, the adaptor device also includes an adaptor circuit that includes a USB hub, a plurality of USB-UART converters, and a multiplexer circuit.

According to another exemplary embodiment of the present invention, a method for accessing a plurality of external devices includes coupling a first processor through a first interface and coupling a second processor through a second interface, the second interface being different than the first interface. The method also includes receiving, at the first interface, a first signal from the first processor; and, in response to the first signal, coupling through a plurality of third interfaces to a corresponding plurality of external devices to enable the first processor substantially concurrent access to the plurality of external devices. The method also includes receiving, at the first interface, a second signal from the first processor, and, in response to the second signal, coupling the second processor with a selected one of the plurality of external devices.

In some embodiments of the above method, the first interface is configured to couple to Universal Serial Bus (USB) signals, and the second interface is configured to couple to Joint Test Action Group (JTAG) signals.

In some embodiments, each of the plurality of external devices is configured to couple to both Universal Asynchronous Receiver Transmitter (UART) signals and JTAG signals.

In some embodiments, the method also includes coupling the first interface to the plurality of third interfaces using a USB-to-UART interface circuit that includes a USB hub and a plurality of USB-UART converters.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1:
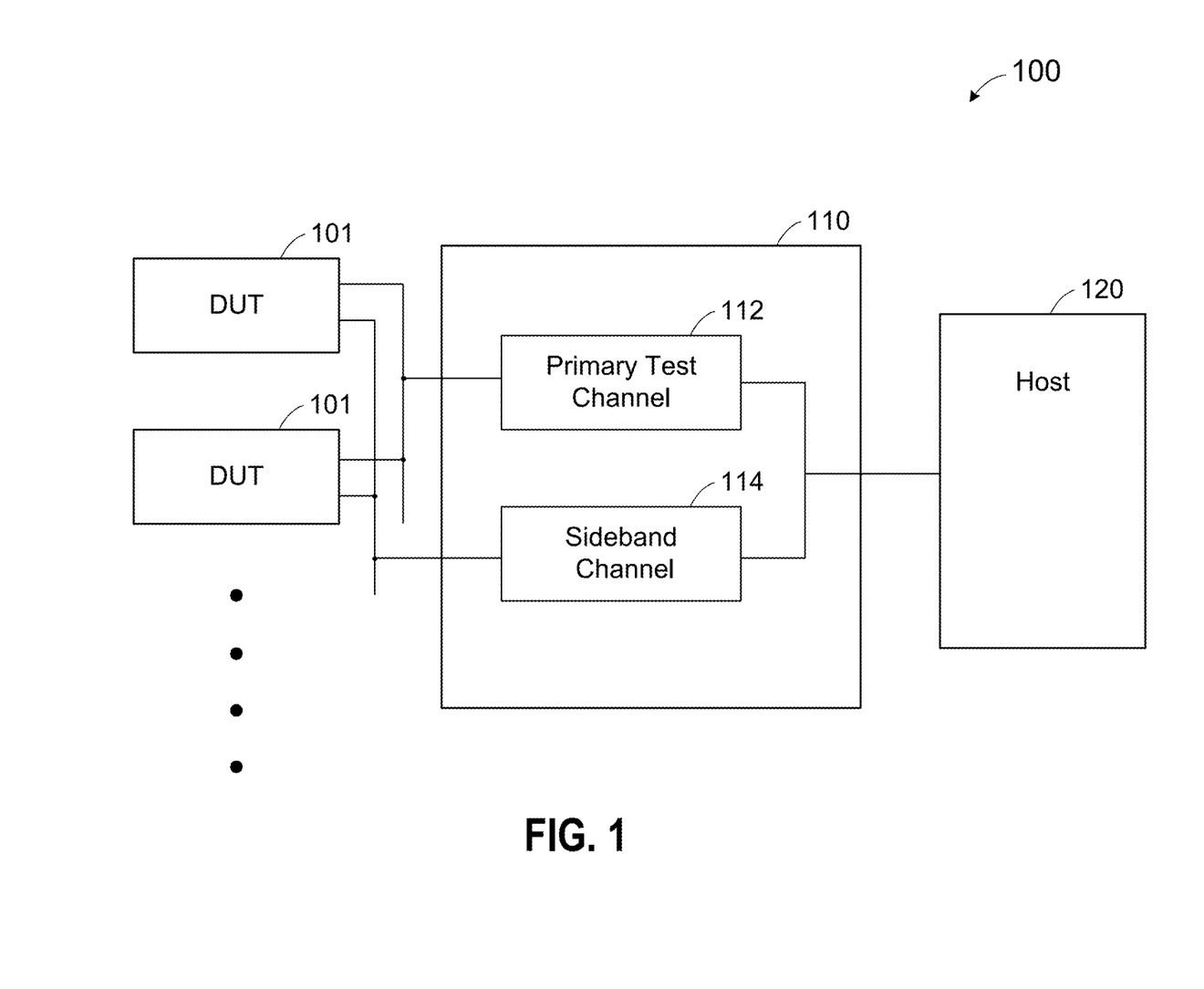
FIG. 1 is a simplified block diagram illustrating an electronic device test system, according to an exemplary embodiment of the present disclosure.

FIG. 1 is a simplified block diagram illustrating an electronic device test system, according to an exemplary embodiment of the present disclosure. As shown in FIG. 1, test system 100 includes one or more devices under test (DUT) 101, a test system 110, and a host 120. Host 120 can include, among other components, a processor for providing user interface. The DUTs 101 are coupled to test system 110, which is coupled to host 120. In some embodiments, test system 110 can provide a primary test channel 112 and a sideband channel 114. The primary test channel 112 can be configured to perform preliminary analysis and reconfiguration of persistent test information, and also perform preliminary analysis reconfiguration of debug information for communication to an external device. The sideband channel 114 can be used to provide a monitoring interface. The monitoring interface can communicate information associated with monitoring activities and traffic inside the device under test.

Solid-state drives under test can use sideband communication channels under protocols like Universal Asynchronous Receiver Transmitter (UART) and Joint Test Action Group (JTAG), etc. In some embodiments, a hardware adapter can convert UART and JTAG channels into a serial bus output, so that standard computer systems can be used for interfacing, logging, and debugging. Existing solutions only support a single UART/JTAG channel, creating setup and stability challenges when multiple solid-state drives are enumerated in a system. Hence, there is a need for a solution which can aggregate multiple UART and JTAG channels, and provide a single serial bus (USB) to a host PC for a cleaner and simpler connection. The various connectors and protocols are briefly described below.

JTAG (Joint Test Action Group, which codified it) is an industry standard for verifying designs and testing printed circuit boards after manufacture. A JTAG interface is a special interface added to a chip. Depending on the version of JTAG, two, four, or five pins are added. In the five-pin version, the connector pins are: Test Data In (TDI), Test Data Out (TDO), Test Clock (TCK), Test Mode Select (TMS), and Test Reset (TRST).

A universal asynchronous receiver-transmitter (UART) is a computer hardware device for asynchronous serial communication, in which the data format and transmission speeds are configurable. The electric signaling levels and methods are handled by a driver circuit external to the UART. A UART is usually an individual (or part of an) integrated circuit (IC) used for serial communications over a computer or peripheral device serial port. UART transmitted data is organized into packets. Each packet contains 1 start bit, 5 to 9 data bits (depending on the UART), an optional parity bit, and 1 or 2 stop bits. A UART device usually has two pins, a transmit pin Tx and a receive pin Rx. Data is transferred from the data bus to the transmitting UART in parallel form. Next, the data packet is output serially, bit by bit, at the Tx pin. The receiving UART reads the data packet bit by bit at its Rx pin. The receiving UART then converts the data back into parallel form and transfers the data packet in parallel to the data bus on the receiving end.

Universal Serial Bus (USB) is an industry standard that establishes specifications for cables and connectors and protocols for connection, communication, and power supply (interfacing) between computers, peripherals, and other computers. Examples of peripherals that are connected via USB include computer keyboards and mice, video cameras, printers, portable media players, disk drives, and network adapters. There are various USB standards and connectors, such as USB Type A, Type B, Type C, USB 1.0, 2.0, 3.0, and 4.0. The basic USB-A and USB-B plugs have four pins: VBUS (+5V), Data−, Data+, and Ground.

Figure 2:
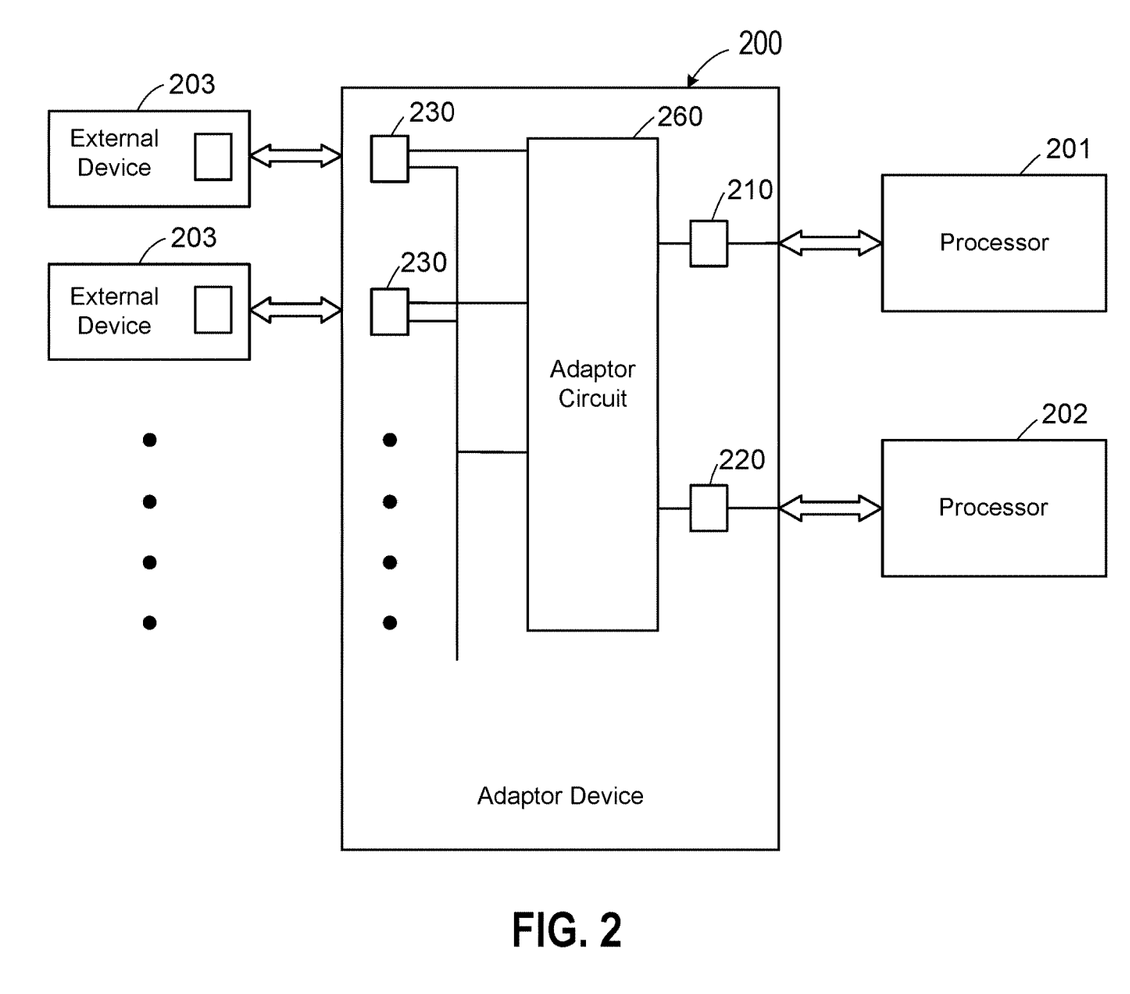
FIG. 2 is a simplified block diagram for an adaptor device, according to an exemplary embodiment of the present disclosure.

FIG. 2 is a simplified block diagram for an adaptor device, according to an exemplary embodiment of the present disclosure. As shown in FIG. 2, an adaptor device 200 includes a first interface 210 for coupling to a first processor 201 and a second interface 220 for coupling to a second processor 202, the second interface being different from the first interface. Adaptor device 200 also includes a plurality of third interfaces 230 for coupling to a corresponding plurality of external devices 203. The plurality of third interfaces 230 are different from the first and the second interfaces. Adaptor device 200 is configured to receive, at the first interface 210, a first signal from the first processor 201. In response to the first signal, adaptor device 200 couples to the plurality of third interfaces 230 to the plurality of external devices 203 to enable the first processor 201 concurrent access to the plurality of external devices 203. Adaptor device 200 is also configured to receive, at the first interface 210, a second signal from the first processor 201. In response to the second signal, adaptor device 200 couples the second processor 202 with a selected one of the plurality of external devices 203.

The adaptor device 200 also includes an adaptor circuit 260 that includes a USB-to-UART interface circuit and a multiplexer circuit. The USB-to-UART interface circuit can include a USB hub and a plurality of USB-UART converters. These components are described in more detail below with reference to FIG. 5.

In some embodiments of adaptor device 200, the first interface 210 is configured to couple to USB signals, and the second interface 220 is configured to couple to JTAG signals.

In some embodiments of adaptor device 200, each of the plurality third interfaces is configured to couple to UART signals and JTAG signals, and each of the plurality of external devices is configured to couple to both UART signals and JTAG signals.

Figure 3:
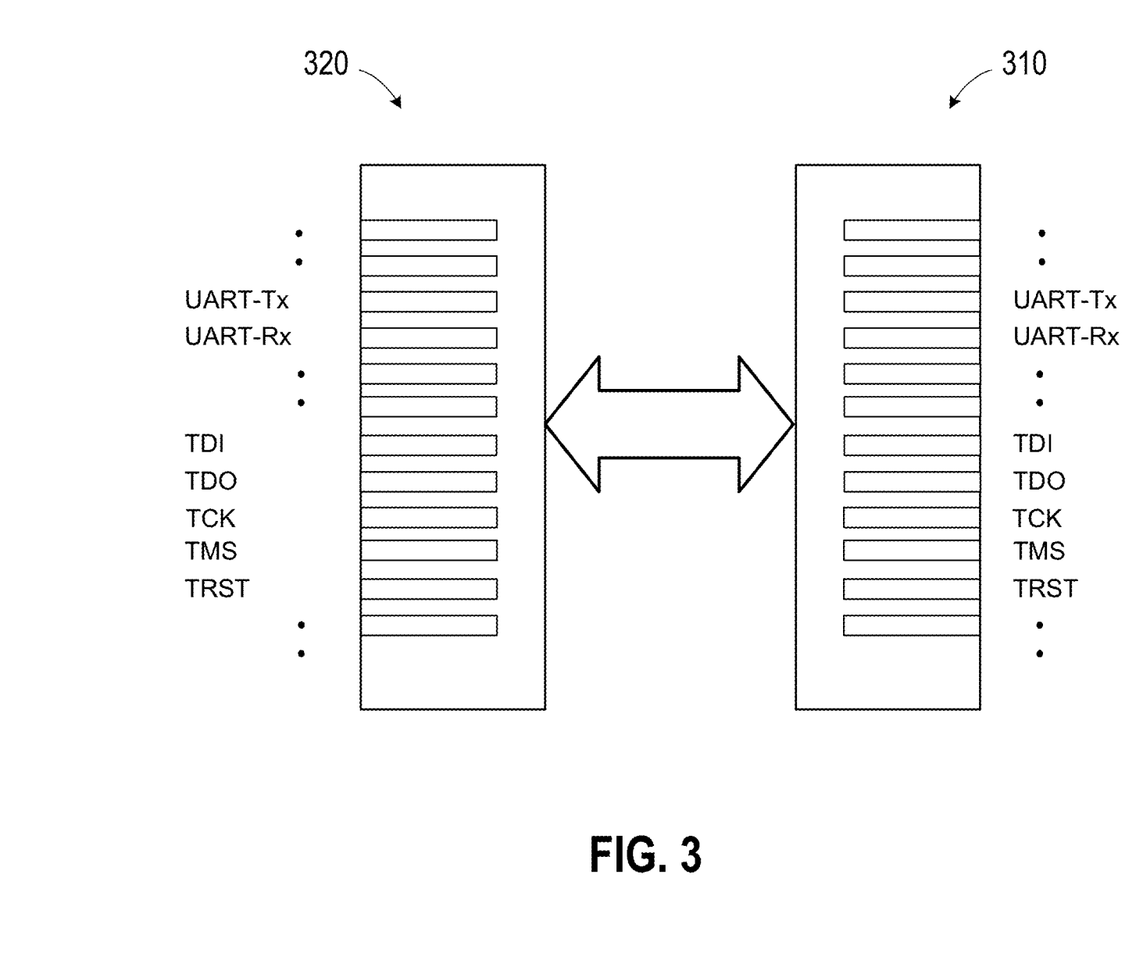
FIG. 3 is a simplified schematic diagram illustrating a dual-purpose connector, according to an exemplary embodiment of the present disclosure.

FIG. 3 is a simplified schematic diagram illustrating dual-purpose connectors, according to an exemplary embodiment of the present disclosure. As shown in FIG. 3, each of dual-purpose connectors 310 and 320 includes pins UART-Tx and UART-Rx configured to couple to UART signals Tx and Rx, respectively. Further, each of dual-purpose connectors 310 and 320 includes pins TDI, TDO, TCK, TMS, and TRST configured to couple to JTAG signals TDI, TDO, TCK, TMS, and TRST, respectively. Dual-purpose connectors 310 and 320 can also include other pins, such as pins for power and ground. In application, dual-purpose connector 310 can be used as third interface 230 in adaptor device 200 in FIG. 2. Further, dual-purpose connector 320 can be used as a dual-purpose connector in external devices 203 in FIG. 2 that can be used for communication with dual-purpose connector 230 in adaptor device 200 in FIG. 2.

Figure 4A:
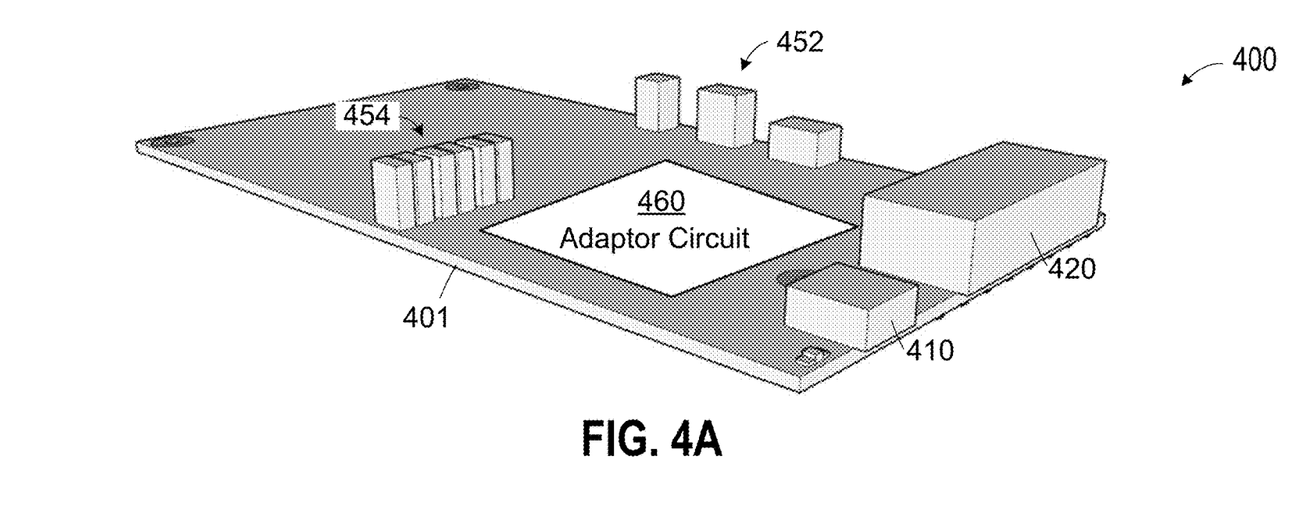
FIGS. 4A and 4B are perspective views of an adaptor device, according to an exemplary embodiment of the present disclosure.
Figure 4B:
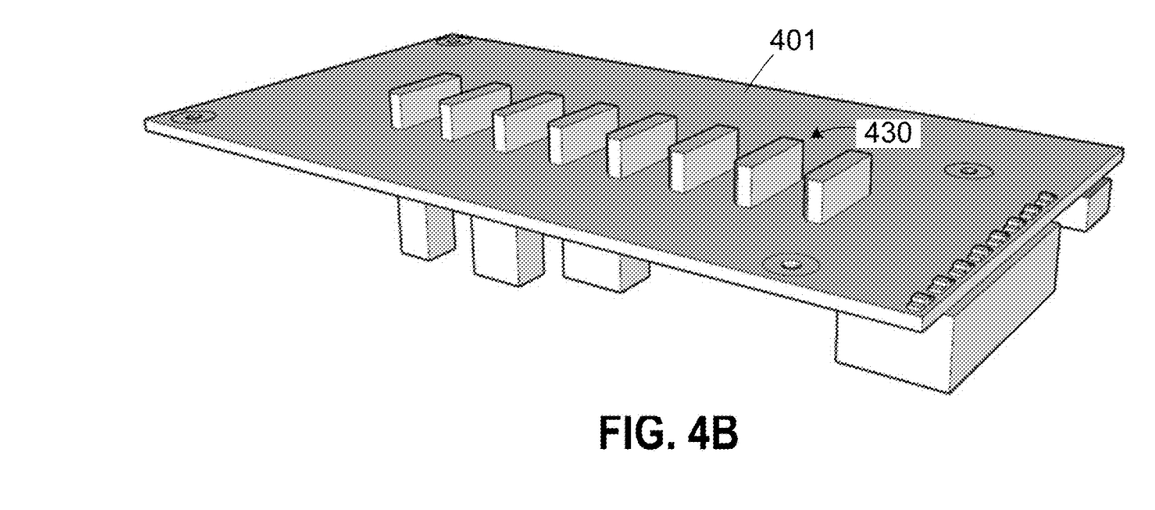

FIGS. 4A and 4B are perspective views of an adaptor device, according to an exemplary embodiment of the present disclosure. FIG. 4A is a bottom perspective view of adaptor device 400, which is an example of adaptor device 200 described above in connection with FIG. 2. As shown in FIG. 4A, adaptor device 400 includes a printed circuit board (PCB) 401 and multiple components disposed on PCB 401. These components include a USB connector 410 and a JTAG connector 420 disposed on PCB 401. USB connector 410 is an example of the first interface 210 in adaptor device 200 of FIG. 2, and JTAG connector 420 is an example of the second interface 210 in adaptor device 200 of FIG. 2. Adaptor device 400 also has an adaptor circuit 460, which is an example of adaptor circuit 260 in adaptor device 200 of FIG. 2. FIG. 4A also shows switches 452 and jumpers 454, whose functions will be described below with reference to FIG. 5.

FIG. 4B is a top perspective view of adaptor device 400. As shown in FIG. 4B, adaptor device 400 includes a plurality of dual-purpose connectors 430 on PCB 401. The plurality of dual-purpose connectors 430 are examples of the third interface 230 in adaptor device 200 described above in connection with FIG. 2. In one example, each dual-purpose connector can be used to be connected to a solid-state drive (SSD), which also has an appropriate dual-purpose connector.

Figure 5:
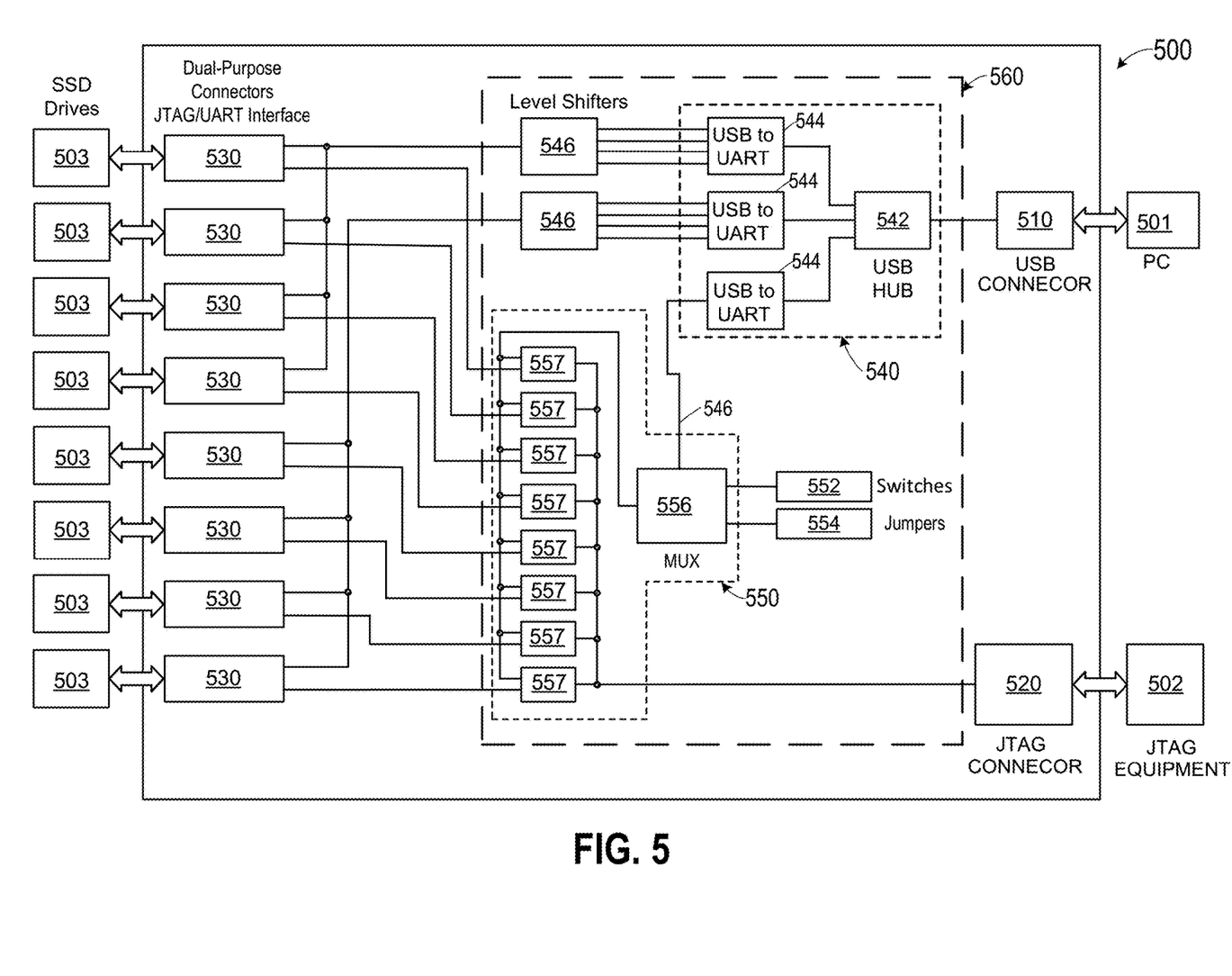
FIG. 5 is a simplified schematic diagram for an adaptor device, according to an exemplary embodiment of the present disclosure.

FIG. 5 is a simplified schematic diagram for an adaptor device, according to an exemplary embodiment of the present disclosure. As shown in FIG. 5, adaptor device 500 includes a USB (Universal Serial Bus) connector 510 for coupling to USB signals, a JTAG (Joint Test Action Group) connector 520 for coupling to JTAG signals, and a plurality of dual-purpose connectors 530 configured for coupling to a corresponding plurality of external devices. Each of the plurality of dual-purpose connectors 530 is configured for coupling to both UART (Universal Asynchronous Receiver-Transmitter) signals and JTAG signals. In the example of FIG. 5, USB connector 510 is shown coupled to a processor 501, which can be a person computer (PC), a laptop computer, or other types of processor. The JTAG connector is shown coupled to a JTAG equipment 502, such as a JTAG compatible test equipment.

In FIG. 5, adaptor device 500 also includes a USB-to-UART interface circuit 540 coupled to the USB connector 510 and the plurality of dual-purpose connectors 530. USB-to-UART interface circuit 540 includes a USB hub 542 and a plurality of USB-UART converters 544. Adaptor device 500 also includes a multiplexer circuit 550 coupled to the JTAG connector 520 and the plurality of dual-purpose connectors 530. Multiplexer circuit 550 is configured to couple the JTAG connector 520 to one of the plurality of dual-purpose connectors 530 in response to a selection signal 546 from the USB-to-UART interface circuit 540. In some embodiments, multiplexer circuit 550 can also select one of the plurality of dual-purpose connectors 530 in response to a switch 552 or jumpers 554.

As shown in FIG. 5, USB-to-UART interface circuit 540 includes a USB hub 542 and a plurality of USB-UART converter circuits 544. USB-to-UART interface circuit 540 is configured to enable the USB connector 510 concurrent access to the plurality of dual-purpose connectors 530.

In some embodiments, USB hub 542 can be a conventional USB hub that expands a USB port into several ports. In the example of FIG. 5, USB hub 542 expands one port couple to USB connector 510 into multiple ports, so that there are more ports available to connect devices to a host system, including eight ports for coupling to eight dual-purpose connectors and one port for coupling a selection signal to the multiplexer circuit 550. All devices connected through a USB hub share the bandwidth available to that hub.

USB-to-UART converter circuits 544 can be a conventional USB to serial adapter having a USB processor chip which processes the USB signals. The USB processor sends the processed USB signals to a serial driver chip, which applies the correct voltages and sends the processed data signals to the serial output, in this case, the UART port. In some embodiments, a commercially available adaptor can be used, such as the FTDI USB-to-UART chip from Future Technology Devices International Limited, in the United Kingdom.

In some embodiments, multiplexer circuit 550 can include a multiplexer 556 and a plurality of switches 557. Multiplexer circuit 550 is configured to receive the selection signal 546 derived from a signal received from the USB connector 510, and, in response to a selection signal, couple the JTAG connector 520 to one of the plurality of dual-purpose connectors 530. In alternative embodiments, multiplexer circuit 550 can also receive the selection signal from manual switches 552 or jumpers 554.

In FIG. 5, the plurality of dual-purpose connectors 530 are configured for coupling to a corresponding plurality of external devices 503. In some embodiments, each of the plurality of external devices 503 is a solid-state drive (SSD). In this example, FIG. 5 shows eight dual-purpose connectors 530 and eight external devices 503. However, the number of connectors and external devices can be varied according to the application.

In FIG. 5, adaptor device 500 also includes level shifter circuits 546 coupled between the USB-to-UART converters 544 and the plurality of dual-purpose connectors 530. The UART signals from external devices are at a 1.8V level. The 3.3V is used to support devices in the adaptor device. The level shifter circuits 546 are used to convert the 1.8V UART signal level to 3.3V, and vice versa. As shown in FIG. 5, USB-to-UART interface circuit 540, level shifter circuits 546, and multiplexer circuit 550 are collectively referred to as adaptor circuit 560. Adaptor circuit 560 is an example of circuit block that can be used as adaptor circuit 260 in adaptor device 200 in FIG. 2.

As described above in connection to FIGS. 4A and 4B, the adaptor device can also include a Printed Circuit Board (PCB), upon which the USB connector 510, the JTAG connector 520, the plurality of dual-purpose connectors 530, and adaptor circuit 560 are disposed.

Figure 6:
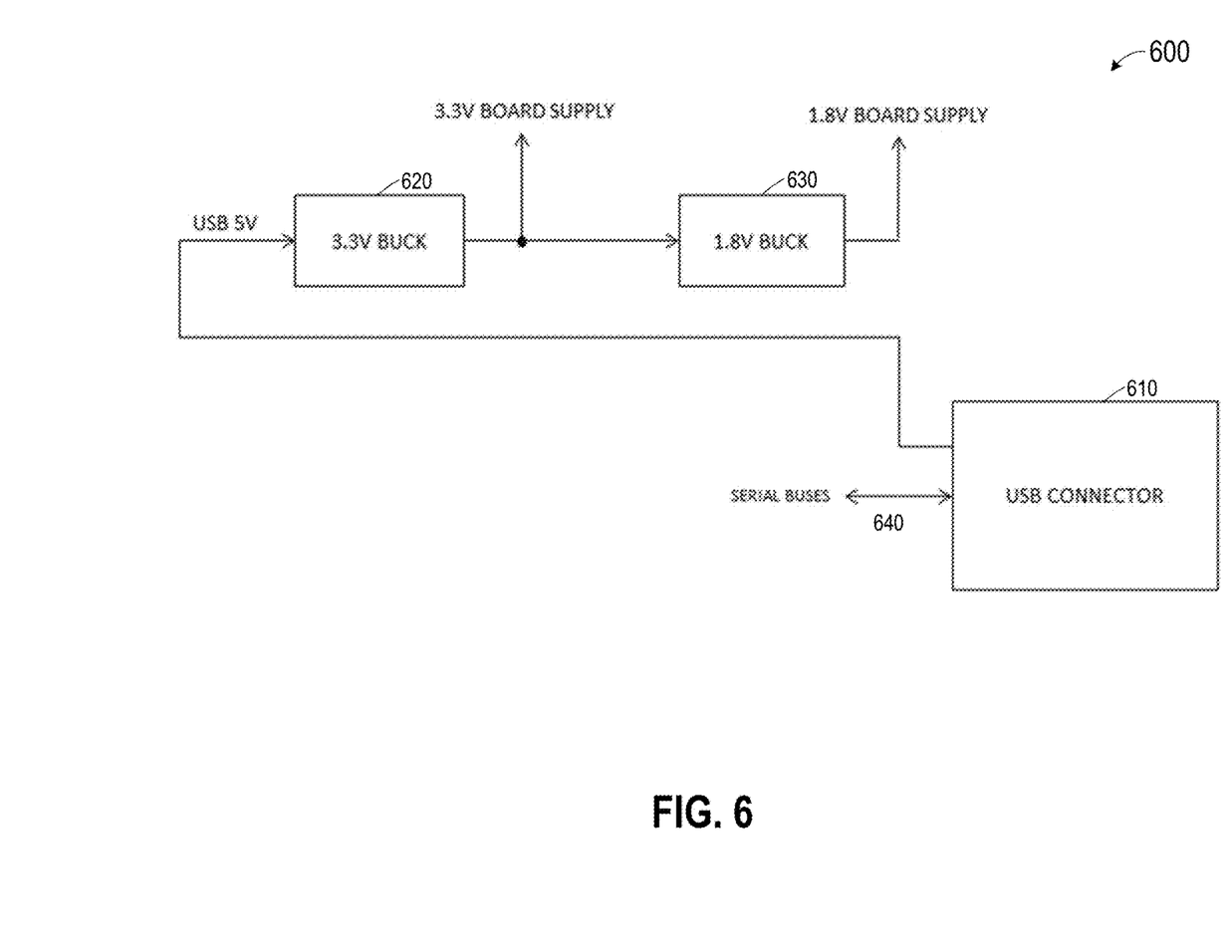
FIG. 6 is a simplified block diagram illustrating a power supply circuit for an adaptor device, according to an exemplary embodiment of the present disclosure.

FIG. 6 is a simplified block diagram illustrating a power supply circuit for an adaptor device, according to an exemplary embodiment of the present disclosure. In some embodiments, the adaptor components and the PCB receive operating power from a host device from a USB port. As shown in FIG. 6, power supply circuit 600 can be part of adaptor device 200 of FIG. 2 or adaptor device 500 of FIG. 5. Power supply circuit 600 includes a USB connector 610 for coupling to a host device, for example a processor, which provides power to the adaptor device. USB connector 610 can be the USB connector 210 of FIG. 2 or USB connector 510 of FIG. 5. In some embodiments, USB connector 610 receives a 5V power supply from the host device. Power supply circuit 600 includes a first power converter 620, a buck converter in this example, coupled to the USB connector 610 and converts the 5V voltage to a 3.3V power supply to the adaptor PCB. Power supply circuit 600 can also include a second power converter 630, also a buck converter, coupled to the first power converter 620 and converts the 3.3V voltage to a 1.5V power supply to the adaptor PCB. FIG. 6 also shows serial buses 640 for coupling to the rest of the components in the adaptor circuit.

Figure 7:
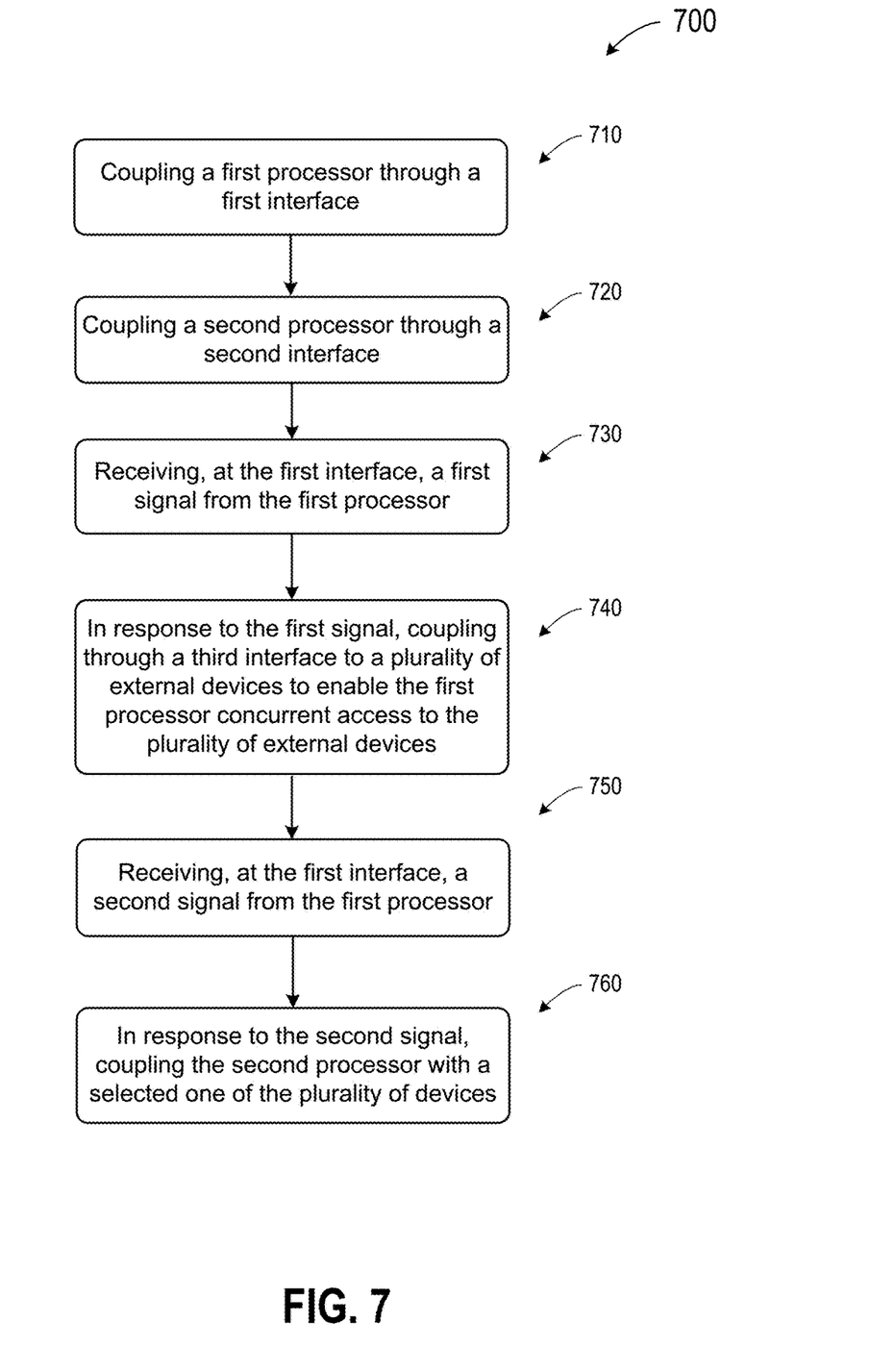
FIG. 7 is a simplified flowchart illustrating a method for accessing a plurality of external devices, according to an exemplary embodiment of the present disclosure.

FIG. 7 is a simplified flowchart illustrating a method for accessing a plurality of external devices, according to an exemplary embodiment of the present disclosure. An example of an adaptor device implementing method 700 in FIG. 7 is described above in connection with FIG. 2. As shown in FIG. 7, the method 700 includes, at 710, coupling a first processor through a first interface. The method includes, at 720, coupling a second processor through a second interface, the second interface being different than the first interface. As shown in FIG. 2, an adaptor device 200 includes a first interface 210 for coupling to a first processor 201 and a second interface 220 for coupling to a second processor 202, the second interface being different than the first interface. Adaptor device 200 also includes a plurality of third interfaces 230 for coupling to a corresponding plurality of external devices 203. The plurality of third interfaces 230 are different from the first and the second interfaces.

At 730, the method includes receiving, at the first interface, a first signal from the first processor. At 740, the method includes, in response to the first signal, coupling through a third interface to a plurality of external devices to enable the first processor concurrent access to the plurality of external devices. As shown in FIG. 2, adaptor device 200 is configured to receive, at the first interface 210, a first signal from the first processor 201. In response to the first signal, adaptor device 200 couples to the plurality of third interfaces 230 to the plurality of external devices 203 to enable the first processor 201 concurrent access to the plurality of external devices 203.

At 750, the method includes receiving, at the first interface, a second signal from the first processor. At 760, the method includes, in response to the second signal, coupling the second processor with a selected one of the plurality of external devices. As shown in FIG. 2, adaptor device 200 is also configured to receive, at the first interface 210, a second signal 221 from the first processor 201. In response to the second signal 221, adaptor device 200 couples the second processor 202 with a selected one of the plurality of external devices 203.

In some embodiments, the first interface is configured to couple to USB signals, and the second interface is configured to couple to JTAG signals. In these embodiments, each of the plurality of external devices is configured to couple to both UART signals and JTAG signals. In some embodiments, the method also includes coupling the first interface to the plurality of external devices using a USB-to-UART interface circuit that includes a USB hub and a plurality of USB-to-UART converters. FIG. 5 illustrates a schematic diagram for an adaptor device 500, which can be used to implement the features described above.

Figure 8:
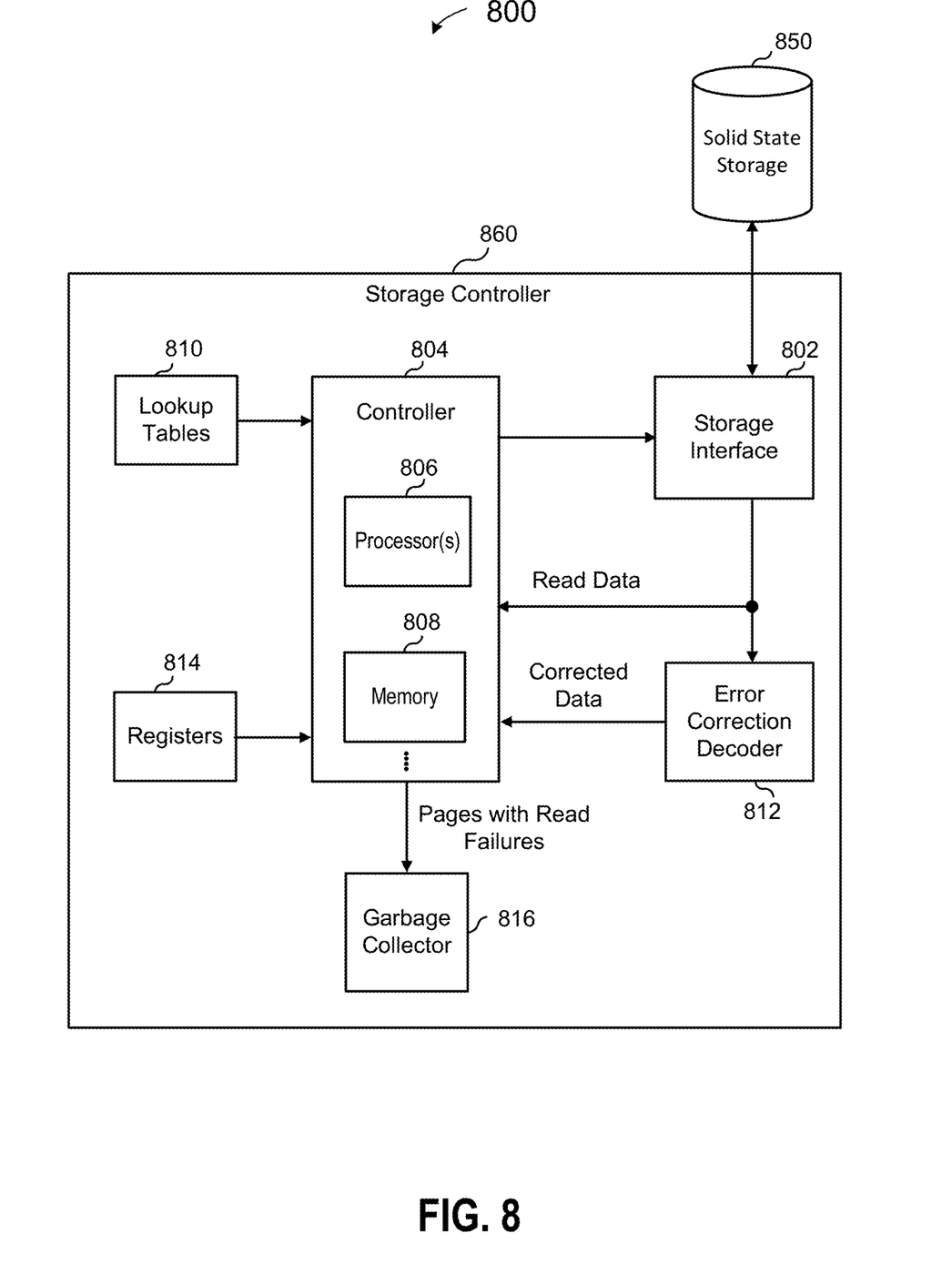
FIG. 8 is a simplified block diagram illustrating a solid-state storage system, in accordance with certain embodiments of the present disclosure.

FIG. 8 is a simplified block diagram illustrating a solid-state storage system, in accordance with certain embodiments of the present disclosure. As shown, solid-state storage system 800 can include a solid-state storage device 850 and a storage controller 860. Storage controller 860, also referred to as a memory controller, is one example of a system that performs the techniques described herein. In some embodiments, storage controller 860 can be implemented on a semiconductor device, such as an application-specific integrated circuit (ASIC) or field programmable gate array (FPGA). Some of the functions can also be implemented in firmware or software. Solid-state storage system 800 is an example of a solid-state drive (SSD), which can be coupled to an adaptor device described above in connection to FIGS. 2-7.

Controller 804 can include one or more processors 806 and memories 808 for performing the control functions described above. Storage controller 860 can also include lookup tables 810, which can include a table for degraded blocks and a table for bad blocks, etc. Registers 814 can be used to store data for control functions, such as threshold values for degraded block counts.

Controller 804 can be coupled to solid-state storage 850 through a storage interface 802. Error-correction decoder 812 (e.g., an LDPC decoder or a BCH decoder) can perform error-correction decoding on the read data and send the corrected data to controller 804. Controller 804 can identify the pages with read failures to garbage collector 816, which performs corrective processing on those pages (e.g., by copying the data, with or without error correction decoding, to a new location).

Figure 9:
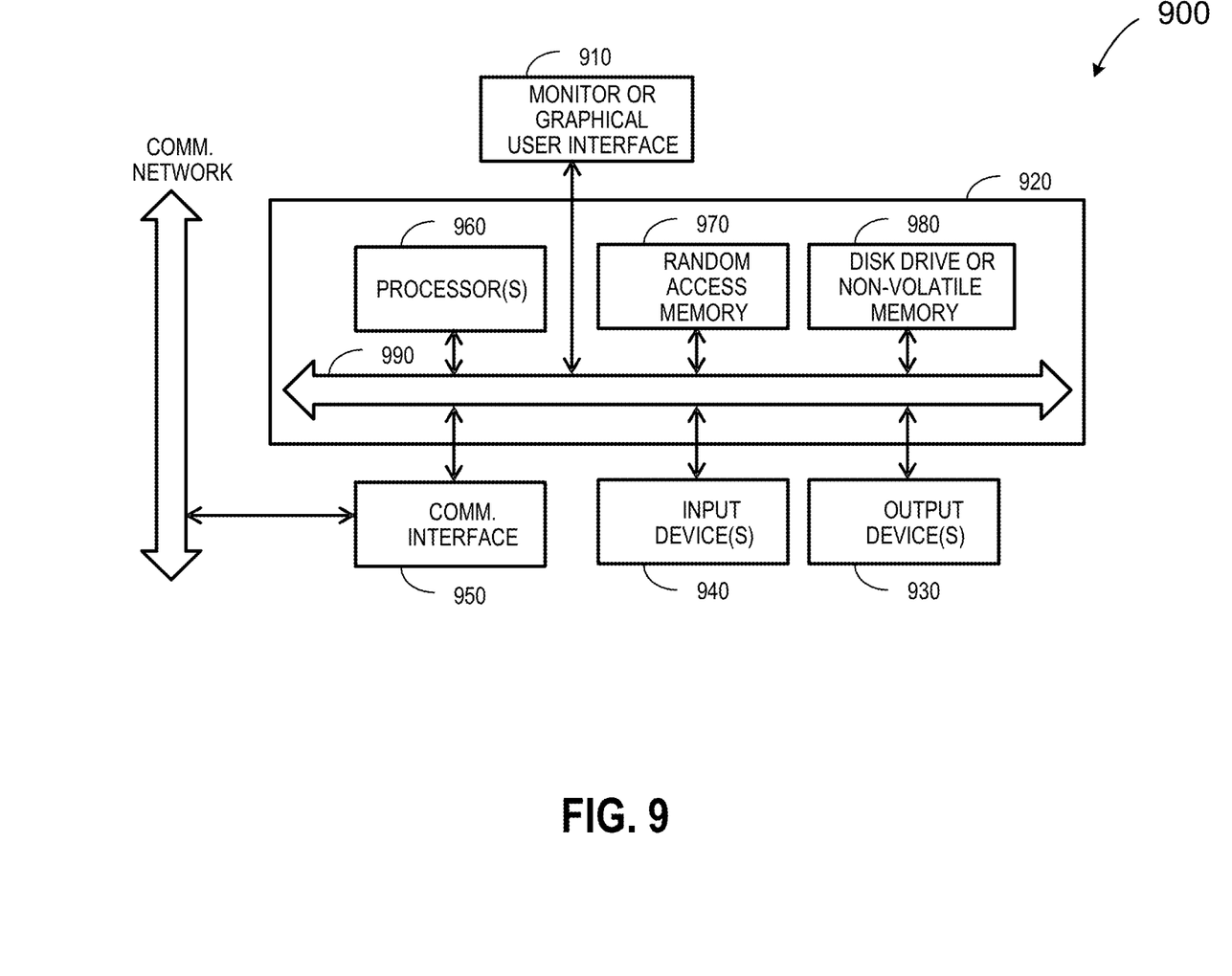
FIG. 9 is a simplified block diagram illustrating an apparatus that may be used to implement various embodiments, according the present disclosure.

FIG. 9 is a simplified block diagram illustrating an apparatus that may be used to implement various embodiments, according the present disclosure. FIG. 9 is merely illustrative of an embodiment incorporating the present disclosure and does not limit the scope of the invention as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

As shown in FIG. 9, computer 920 may include a processor(s) 960 that communicates with a number of peripheral devices via a bus subsystem 990. These peripheral devices may include user output devices 930, user input devices 940, communications interface 950, and a storage subsystem, such as random-access memory (RAM) 970 and disk drive 980. As an example, a disk drive 980 can include SSD implemented with non-volatile memory devices, such as SSD 203 depicted in FIG. 2, SSD 503 in FIG. 5, or solid-state storage system 800 in FIG. 8. Further, computer system 900 is an example of a device that can be used as first processor 201 or second processor 202 in FIG. 2, or as processor 501 in FIG. 5.

User input devices 940 include all possible types of devices and mechanisms for inputting information to computer system 920. These may include a keyboard, a keypad, a touch screen incorporated into the display, audio input devices such as voice recognition systems, microphones, and other types of input devices. In various embodiments, user input devices 940 are typically embodied as a computer mouse, a trackball, a trackpad, a joystick, a wireless remote, a drawing tablet, a voice command system, an eye-tracking system, and the like. User input devices 940 typically allow a user to select objects, icons, text, and the like that appear on the monitor 910 via a command, such as a click of a button or the like.

User output devices 930 include all possible types of devices and mechanisms for outputting information from computer 920. These may include a display (e.g., monitor 910), non-visual displays, such as audio output devices.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, integrated services digital network (ISDN)), (asynchronous) digital subscriber line (DSL) unit, FireWire interface, USB interface, and the like. For example, communications interface 950 may be coupled to a computer network, to a FireWire bus, or the like. In other embodiments, communications interfaces 950 may be physically integrated on the motherboard of computer 920 and may be a software program, such as soft DSL or the like.

In various embodiments, computer system 900 may also include software that enables communications over a network such as the Hypertext Transfer Protocol (HTTP), the Transmission Control Protocol and the Internet Protocol (TCP/IP), the Real Time Streaming Protocol and Real-time Transport Protocol (RTSP/RTP), and the like. In alternative embodiments of the present disclosure, other communications software and transfer protocols may also be used, for example Internetwork Packet Exchange (IPX), User Datagram Protocol (UDP), or the like. In some embodiments, computer 920 includes one or more Xeon microprocessors from Intel as processor(s) 960. Further, in one embodiment, computer 920 includes a UNIX-based operating system.

RAM 970 and disk drive 980 are examples of tangible media configured to store data, such as embodiments of the present disclosure, including executable computer code, human-readable code, or the like. Other types of tangible media include floppy disks, removable hard disks, optical storage media, such as CD-ROMs, DVDs and bar codes, semiconductor memories, such as flash memories, non-transitory read-only memories (ROMs), battery-backed volatile memories, networked storage devices, and the like. RAM 970 and disk drive 980 may be configured to store the basic programming and data constructs that provide the functionality of the present disclosure.

Software code modules and instructions that provide the functionality of the present invention may be stored in RAM 970 and disk drive 980. These software modules may be executed by processor(s) 960. RAM 970 and disk drive 980 may also provide a repository for storing data used in accordance with the present disclosure.

RAM 970 and disk drive 980 may include a number of memories, including a main RAM for storage of instructions and data during program execution and a ROM in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses. Bus system 990 may be a Peripheral Component Interconnect (PCI) Express bus that may be implemented using Peripheral Component Interconnect Express (PCIe) physical layer (PHY) embodiments of the present disclosure.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation; Solaris from Sun Microsystems; LINUX; UNIX; and the like. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that the disclosure's usefulness is not limited thereto and that the embodiments of the present disclosure can be beneficially implemented in any number of environments for any number of purposes.

What is claimed is:

1. An adaptor device, comprising:
a Universal Serial Bus (USB) connector for coupling to USB signals;
a Joint Test Action Group (JTAG) connector for coupling to JTAG signals;
a plurality of dual-purpose connectors configured for coupling to a corresponding plurality of external devices, each of the plurality of dual-purpose connectors configured for coupling a corresponding external device to both Universal Asynchronous Receiver-Transmitter (UART) signals and JTAG signals;
a USB-to-UART interface circuit coupled to the USB connector and the plurality of dual-purpose connectors, the USB-to-UART interface circuit including a USB hub and a plurality of USB-UART converters; and
a multiplexer circuit coupled to the JTAG connector and the plurality of dual-purpose connectors and configured to couple the JTAG connector to one of the plurality of dual-purpose connectors in response to a selection signal.

2. The adaptor device of claim 1, wherein each of the plurality of dual-purpose connectors comprises a first subset of pins configured for coupling to UART signals and a second subset of pins operable for coupling to JTAG signals.

3. The adaptor device of claim 2, wherein each of the plurality of dual-purpose connector comprises two UART pins and five JTAG pins.

4. The adaptor device of claim 1, wherein each of the plurality of external devices is a solid-state drive (SSD).

5. The adaptor device of claim 4, wherein each SSD device comprises a dual-purpose connector having both UART pins and JTAG pins for coupling to a corresponding plurality of external devices.

6. The adaptor device of claim 4, wherein each SSD is coupled to a dual-purpose connector through an adaptor for coupling to both UART signals and JTAG signals.

7. The adaptor device of claim 1, wherein the USB-to-UART interface circuit comprises a USB hub and a plurality of USB-to-UART converter circuits, and the USB-to-UART interface circuit is configured to enable the USB connector to have substantially concurrent access to the plurality of dual-purpose connectors.

8. The adaptor device of claim 1, wherein the multiplexer circuit receives the selection signal derived from a signal received from the USB connector and configured to couple the JTAG connector to one of the plurality of dual-purpose connectors in response to a selection signal.

9. The adaptor device of claim 1, wherein the multiplexer circuit receives the selection signal from a jumper.

10. The adaptor device of claim 1, further comprising level shifter circuits coupled between the USB-to-UART converters and the dual-purpose connectors.

11. The adaptor device of claim 1, further comprising a power converter circuit to convert power received from the USB connector to voltages suitable for circuit components in the adaptor device.

12. The adaptor device of claim 1, further comprising a Printed Circuit Board (PCB) upon which the USB connector, the JTAG connector, the plurality of dual-purpose connectors, and the USB-to-UART switching circuit are disposed.

13. An adaptor device, comprising:
a first interface for coupling to a first processor;
a second interface for coupling to a second processor, the second interface being different from the first interface; and
a plurality of third interfaces, which is different from either the first interface or the second interface, the plurality of third interfaces configured for coupling to a corresponding plurality of external devices,
wherein the adaptor device is configured to:
receive, at the first interface, a first signal from the first processor;
in response to the first signal, couple through the plurality of third interfaces to the plurality of external devices to enable the first processor substantially concurrent access to the plurality of external devices;
receive, at the first interface from the first processor, a second signal to select one of the plurality of external devices; and
in response to the second signal, couple the second processor with a selected one of the plurality of external devices.

14. The adaptor device of claim 13, wherein the first interface is configured to couple to Universal Serial Bus (USB) signals, and the second interface is coupled to couple to Joint Test Action Group (JTAG) signals.

15. The adaptor device of claim 13, wherein:
each of the plurality third interfaces is configured to couple to Universal Asynchronous Receiver-Transmitter (UART) signals and Joint Test Action Group (JTAG) signals; and
each of the plurality of external devices is configured to couple to UART signals and JTAG signals.

16. The adaptor device of claim 15, further comprising an adaptor circuit that includes a Universal Serial Bus (USB) hub, a plurality of USB-UART converters, and a multiplexer circuit.

17. A method for accessing a plurality of external devices, comprising:
coupling a first processor through a first interface;
coupling a second processor through a second interface, the second interface being different than the first interface;
receiving, at the first interface, a first signal from the first processor;
in response to the first signal, coupling through a plurality of third interfaces to a corresponding plurality of external devices to enable the first processor substantially concurrent access to the plurality of external devices;
receiving, at the first interface from the first processor, a second signal to select one of the plurality of external devices; and
in response to the second signal, coupling the second processor to a selected one of the plurality of external devices.

18. The method of claim 17, wherein the first interface is configured to couple to Universal Serial Bus (USB) signals, and the second interface is configured to couple to Joint Test Action Group (JTAG) signals.

19. The method of claim 18, wherein each of the plurality of external devices is configured to couple to both Universal Asynchronous Receiver Transmitter (UART) signals and JTAG signals.

20. The method of claim 19, further comprising coupling the first interface to the plurality of third interfaces using a USB-to-UART interface circuit that includes a USB hub and a plurality of USB-to-UART converters.

* * * * *